(12) United States Patent
Chevallier

(10) Patent No.: US 6,574,148 B2
(45) Date of Patent: Jun. 3, 2003

(54) DUAL BIT LINE DRIVER FOR MEMORY

(75) Inventor: Christophe Chevallier, Palo Alto, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/904,233

(22) Filed: Jul. 12, 2001

(65) Prior Publication Data

US 2003/0012053 A1 Jan. 16, 2003

(51) Int. Cl.[7] .............................................. G11C 16/06
(52) U.S. Cl. ............................ 365/185.23; 365/185.33; 365/230.06
(58) Field of Search ................. 365/185.23, 185.33, 365/230.06, 189.04, 189.01, 185.26, 190

(56) References Cited

U.S. PATENT DOCUMENTS

| | | | | |
|---|---|---|---|---|
| 5,299,147 A | * | 3/1994 | Holst | ................... 365/189.01 |
| 5,487,044 A | * | 1/1996 | Kawaguchi et al. | ... 365/189.01 |
| 6,055,178 A | * | 4/2000 | Naji | ........................... 365/158 |
| 6,058,060 A | * | 5/2000 | Wong | .................... 365/185.03 |
| 6,101,150 A | | 8/2000 | Roohparvar | |
| 6,285,593 B1 | * | 9/2001 | Wong | .................... 365/185.23 |
| 6,285,608 B1 | | 9/2001 | Roohparvar | |
| 6,363,000 B2 | * | 3/2002 | Perner et al. | ................ 365/173 |

\* cited by examiner

*Primary Examiner*—David Lam
(74) *Attorney, Agent, or Firm*—Leffert Jay & Polglaze P.A.

(57) ABSTRACT

A non-volatile memory device has memory cells arranged in addressable columns. The memory cells in each column are coupled to a common bit line. Bit line driver circuitry coupled to the bit line includes multiple drivers. In one embodiment, two drivers are coupled to opposite ends of the bit line. The driver circuits can be activated together, or separately, in response to decoder circuitry. The memory device can be a flash memory device having floating gate memory cells.

31 Claims, 4 Drawing Sheets

DUAL BIT LINE DRIVER FOR MEMORY

TECHNICAL FIELD OF THE INVENTION

The present invention relates generally to memory devices and in particular the present invention relates to non-volatile memory devices and bit line drivers.

BACKGROUND OF THE INVENTION

Electrically erasable and programmable read only memories (EEPROMs) are reprogrammable non-volatile memories that are widely used in computer systems for storing data. The typical data storage element of an EEPROM is a floating gate transistor. The floating gate transistor is a field-effect transistor (FET) having an electrically isolated (floating) gate that controls electrical conduction between source and drain regions. Data is represented by charge stored on the floating gate and the resulting conductivity obtained between source and drain regions.

For example, a floating gate memory cell can be formed in a P-type substrate with an N-type diffused source region and an N-type drain diffusion formed in the substrate. The spaced apart source and drain regions define an intermediate channel region. A floating gate, typically made of doped polysilicon, is located over the channel region and is electrically isolated from the other cell elements by oxide. For example, a thin gate oxide can be located between the floating gate and the channel region. A control gate is located over the floating gate and can also be made of doped polysilicon. The control gate is separated from the floating gate by a dielectric layer.

To program a memory cell, a high positive voltage Vg, such as +12 volts, is applied to the control gate of the cell. In addition, a moderate positive voltage of about +5 volts is applied to the drain (Vd) and the source voltage (Vs) and the substrate voltage (Vsub) are at ground level. In prior memories, the power supply current requirements for the +12 volts applied to the control gate and the +5 volts applied to the drain region are in the order of a few hundreds of micro amps per cell being programmed. The small current requirement is due, in large part, to the fact that only a few flash cells are ever programmed at one time. Thus, these voltages can be generated on the integrated circuit utilizing charge pump circuitry that is powered by the primary supply voltage Vcc. The above voltage ranges are based upon the assumption that the primary supply voltage Vcc for the memory is +3 volts.

The above conditions result in the inducement of hot electron injection in the channel region near the drain region of the memory cell. These high-energy electrons travel through the thin gate oxide towards the positive voltage present on the control gate and collect on the floating gate. The electrons remain on the floating gate and function to increase the effective threshold voltage of the cell as compared to a cell that has not been programmed.

As memory cell population densities increase, the physical space allocated to device components decreases. For example, bit lines used to couple memory cells located in a column of the memory device may increase in length and decrease in width. These changes in the bit lines result in an increased unit resistance for the bit line. Bit line driver circuits must be able to provide higher program voltages to overcome the increased voltage drop along bit lines as a result of the increased resistance. The higher program voltages can result in disturb conditions of memory cells that are couple to the bit line.

For the reasons stated above, and for other reasons stated below which will become apparent to those skilled in the art upon reading and understanding the present specification, there is a need in the art for a non-volatile memory device with improved data driver circuitry.

SUMMARY OF THE INVENTION

The above-mentioned problems with memory devices and other problems are addressed by the present invention and will be understood by reading and studying the following specification.

In one embodiment, a memory device comprises an array of non-volatile memory cells arranged in rows and columns, a bit line coupled to a portion of the nonvolatile memory cells, and first and second driver circuits respectively coupled to first and second end regions of the bit line.

In another embodiment, a flash memory device comprises an array of floating gate non-volatile memory cells arranged in rows and columns, a bit line coupled to a portion of the non-volatile memory cells, first and second driver circuits respectively coupled to first and second end regions of the bit line, and a decoder circuit to selectively activate the first and second driver circuits.

A method of programming a non-volatile memory is provided. The method comprises selecting a first non-volatile memory cell, identifying a bit line coupled to the first non-volatile memory cell, and activating either a first or second bit line driver coupled to the identified bit line.

In yet another embodiment, a non-volatile memory device comprises an array of non-volatile memory cells arranged in rows and columns, a bit line having a resistance of R and coupled to the non-volatile memory cells, and X distributed driver circuits coupled to the bit line. A resistance between each of the non-volatile memory cells and any of the driver circuits is less than R/X, and less than R/2(X−1) in another embodiment. In addition, X is two or more.

DETAILED DESCRIPTION OF THE INVENTION

In the following detailed description of the preferred embodiments, reference is made to the accompanying drawings that form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims.

Figure 1:
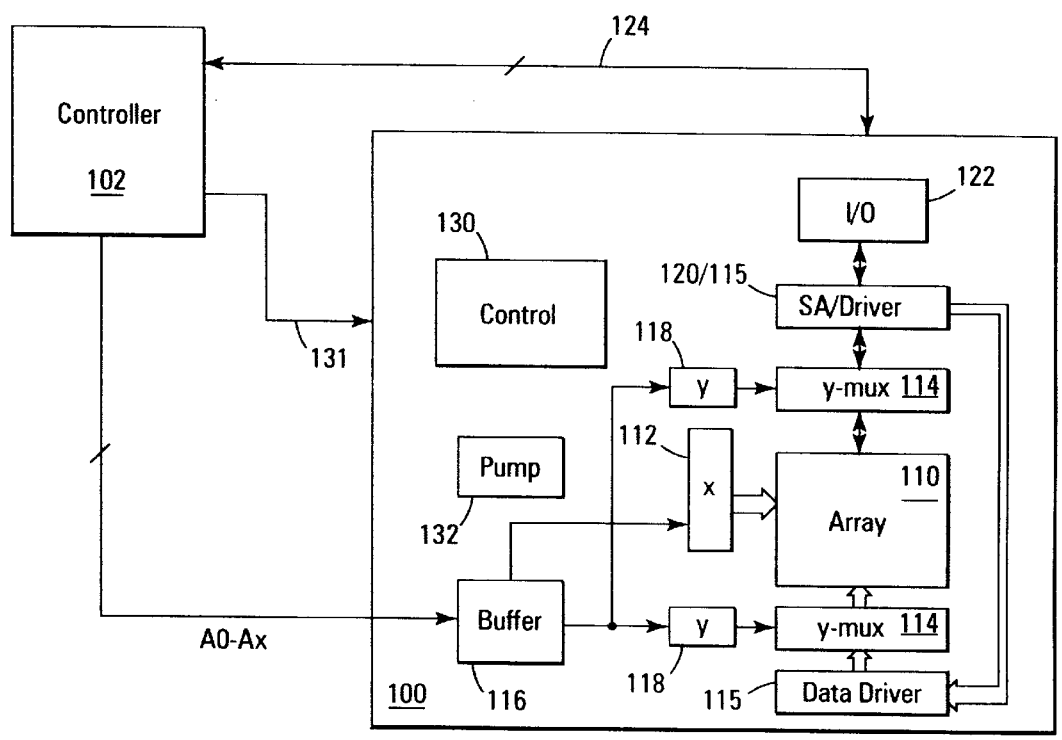
FIG. 1 is a block diagram of a memory of one embodiment of the present invention.

FIG. 1 illustrates a block diagram of a flash memory device 100 that is coupled to a controller 102. The memory device has been simplified to focus on features of the memory that are helpful in understanding the present invention. The memory device includes an array of memory cells 110. The memory cells are preferably floating gate memory cells, and the array is arranged blocks of rows and columns. The blocks allow memory cells to be erased in large groups. Data, however, is stored in the memory array in small data groups (byte or group of bytes) and separate from the block structure. Erase operations are usually performed on a large number of cells in parallel.

An x-decoder 112 and y-decoders 114 are provided to decode address signals provided on address lines A0-Ax. Address signals are received and decoded to access the memory array. An address buffer circuit 116 is provided to latch the address signals. A y-decoder circuit is provided to select a column of the array and includes a y-select circuit 118, and a y-mux 114. Sense amplifier and compare circuitry 120 is used to sense data stored in the memory cells and verify the accuracy of stored data. Data driver circuitry 115 is provided at opposite ends of array 110, as explained below, to efficiently drive data to bit lines of the array.

Data input and output buffer circuits 122 are included for bi-directional data communication over a plurality of data (DQ) lines 124 with the processor. Command control circuit 130 decodes signals provided on control lines 131 from the processor. These signals are used to control the operations of the memory, including data read, data write, and erase operations. A state machine(s) can be provided as part of the control circuitry to perform read, write and erase operations. The flash memory may include a charge pump circuit 132 that generates an elevated voltage, Vpp, used during programming of the memory cells and other internal operations. During write operations, Vpp is coupled to the memory cells for providing appropriate write operation programming power. Charge pump designs are known to those skilled in the art, and provide power which is dependant upon an externally provided supply voltage Vcc. Typically, a flash memory will include separate charge pumps to provide for different needs, such as charge pumps that generate a 12 volt and 5 volt supplies.

As stated above, the flash memory of FIG. 1 has been simplified to facilitate a basic understanding of the features of the memory. Further, it will be appreciated that more than one flash memory can be included in various package configurations. For example, flash memory cards can be manufactured in varying densities using numerous flash memories.

Figure 2:
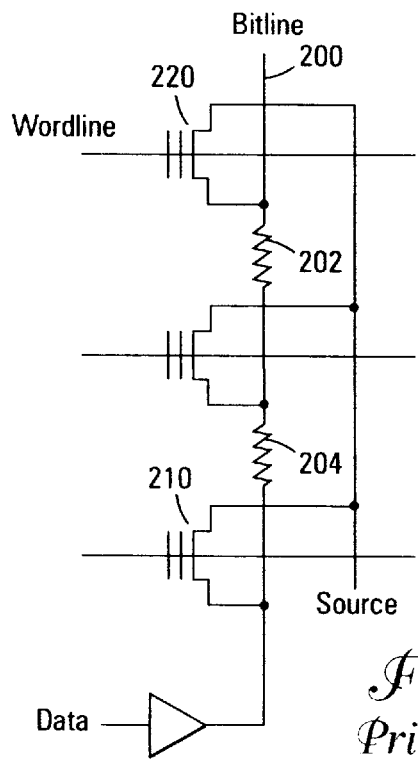
FIG. 2 illustrates a prior art bit line driver.

FIG. 2 illustrates a portion of a prior memory array column, or bit line 200. The bit line is coupled to numerous memory cell drain regions. Resistors 202 and 204 (Rbl) in FIG. 2 together represent the memory bit line resistance. During program operations, a bit line driver circuit 210 is coupled to the bit line to provide a programming voltage. As illustrated, a bit line driver circuit is coupled to one end of the bit line. To program a memory cell 220 located at an opposite end of the bit line, the bit line driver circuit must provide a voltage that accounts for the bit line voltage drop. For example, the single bit line driver circuit must provide a voltage (Vdriver) equal to the desired program voltage (Vd) plus a bit line voltage drop (Vbl). The Vbl can be defined as the bit line resistance (Rbl) times the programming current (Ip). In other words, Vdriver=Vd+(Rbl*Ip). Data driver 210 can be part of data driver 115 of FIG. 1. Further, Y-mux 114 has been omitted in FIG. 2 for clarity.

Figure 3:
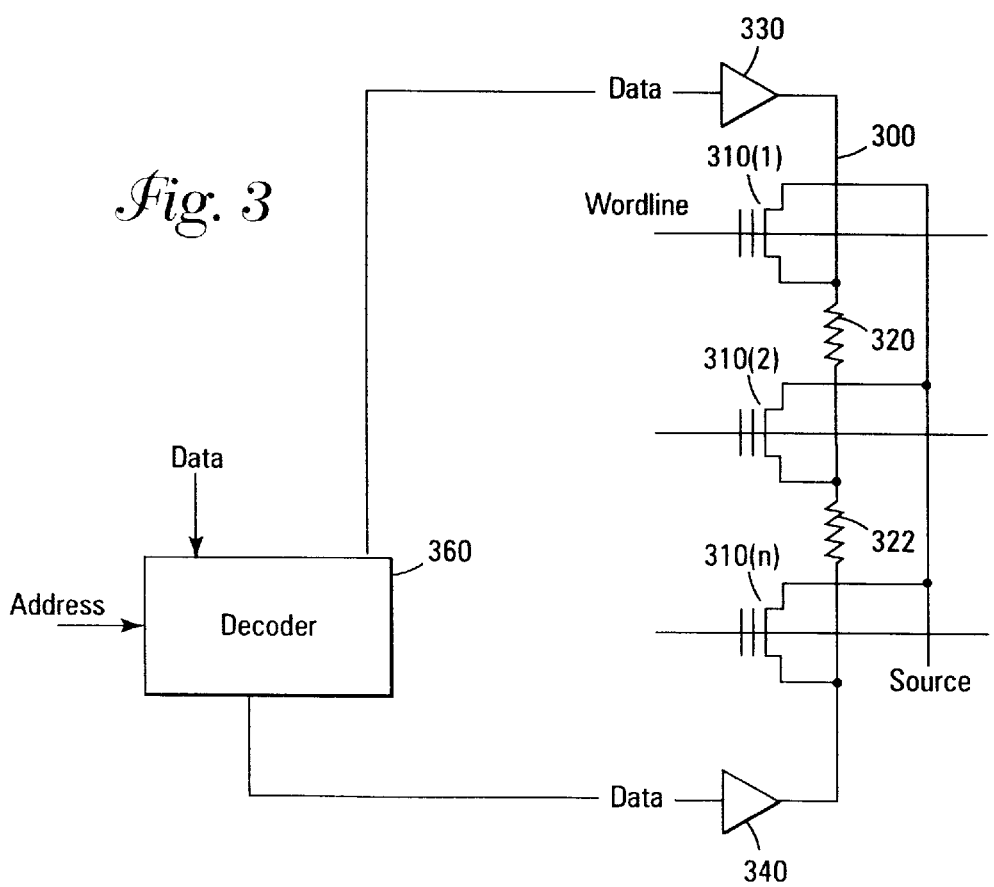
FIG. 3 illustrates a bit line and driver circuit of one embodiment of the present invention.

Referring to FIG. 3, a portion of a memory array column of one embodiment of the present invention is illustrated. Bit line 300 is coupled to numerous non-volatile memory cells 310(1)–310(n), such as floating gate memory cells. The bit line can be fabricated using either a conductive or semi-conductive material. For example, the bit line can be fabricated using an aluminum or copper alloy, or a polysilicon material. The bit line is typically fabricated in a symmetrical manner and therefore has a uniform distributed resistance. Resistors 320 and 322 (Rbl) in FIG. 3 represent the memory bit line resistance.

A pair of bit line driver circuits 330 and 340 are coupled to the bit line. Each one of the driver circuits is coupled to an opposite end region of the bit line 300. As such, all of the memory cells of bit line are located within one-half of the bit line resistance, Rbl, to a bit line driver. If the bit line is driven from only one side, the other side has the most resistance from the driver. If the bit line is driven from both ends, the memory cell 310(2) located in the center has the most resistance from the drivers. The voltage at this point is Vdriver. Thus, the bit line resistance from the driver to the memory cell is half of Rbl, Vdriver=Vd+(Rbl/2*Ip). If the bit line is driven from both ends, the equivelant resistance becomes Rbl/2 twice in parallel, therefore Rbl/4. As a result, Vdriver=Vd+Rbl/4*Ip. The voltage supplied by both driver circuits, therefore, can be reduced compared to a single driver configuration.

Figure 4:
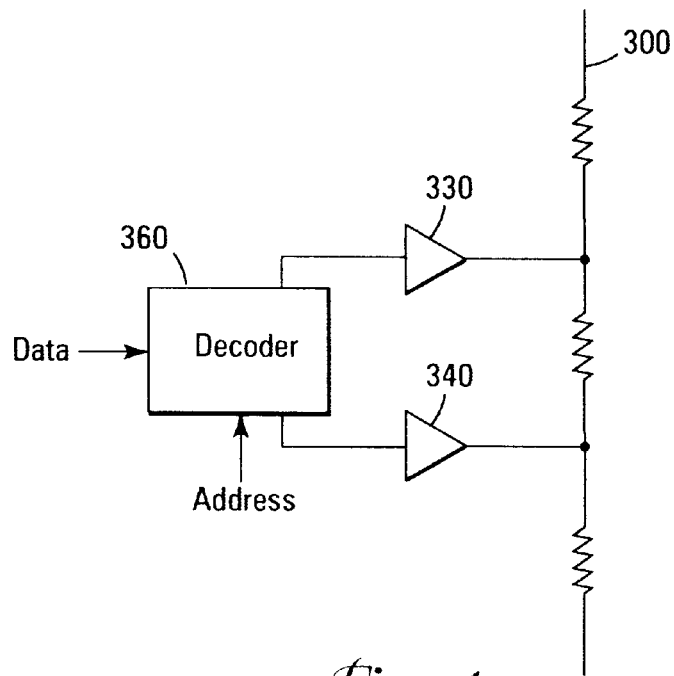
FIG. 4 illustrates a bit line and driver circuitry of an alternate embodiment of the present invention.
Figure 5:
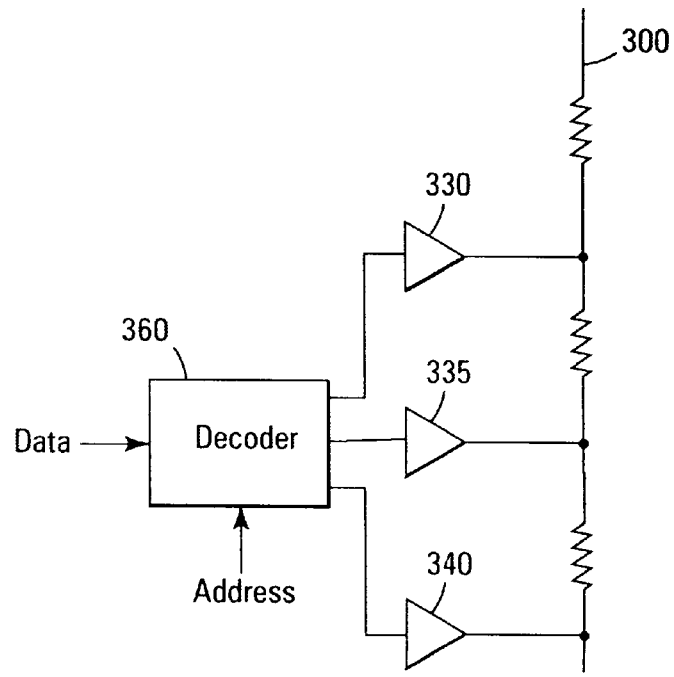
FIG. 5 illustrates a bit line and driver circuit of another embodiment of the present invention.

In an alternate embodiment, the driver circuits 330 and 340 can be distributed along the bit line and not limited to end region locations, see FIG. 4. Likewise, additional driver circuits can be distributed along the bit lines to further reduce the driver voltage requirement. For example, a bit line having a resistance of R is coupled to the non-volatile memory cells, and X distributed driver circuits are coupled to the bit line. A resistance between each of the non-volatile memory cells and any of the driver circuits is less than R/X. With driver circuits at both ends and distributed drivers, the resistance between each of the non-volatile memory cells and any one of the driver circuits is less than R/2(X−1). An equivalent resistance between any memory cell and all of the bit line driver circuits is less than R/4(X−1). That is, by activating all of the distributed driver circuits reduces the equivalent resistance to all of the memory cells, including the worst-case memory cell. See FIG. 5 for a memory that uses three distributed driver circuits 330, 335 and 340.

Figure 6:
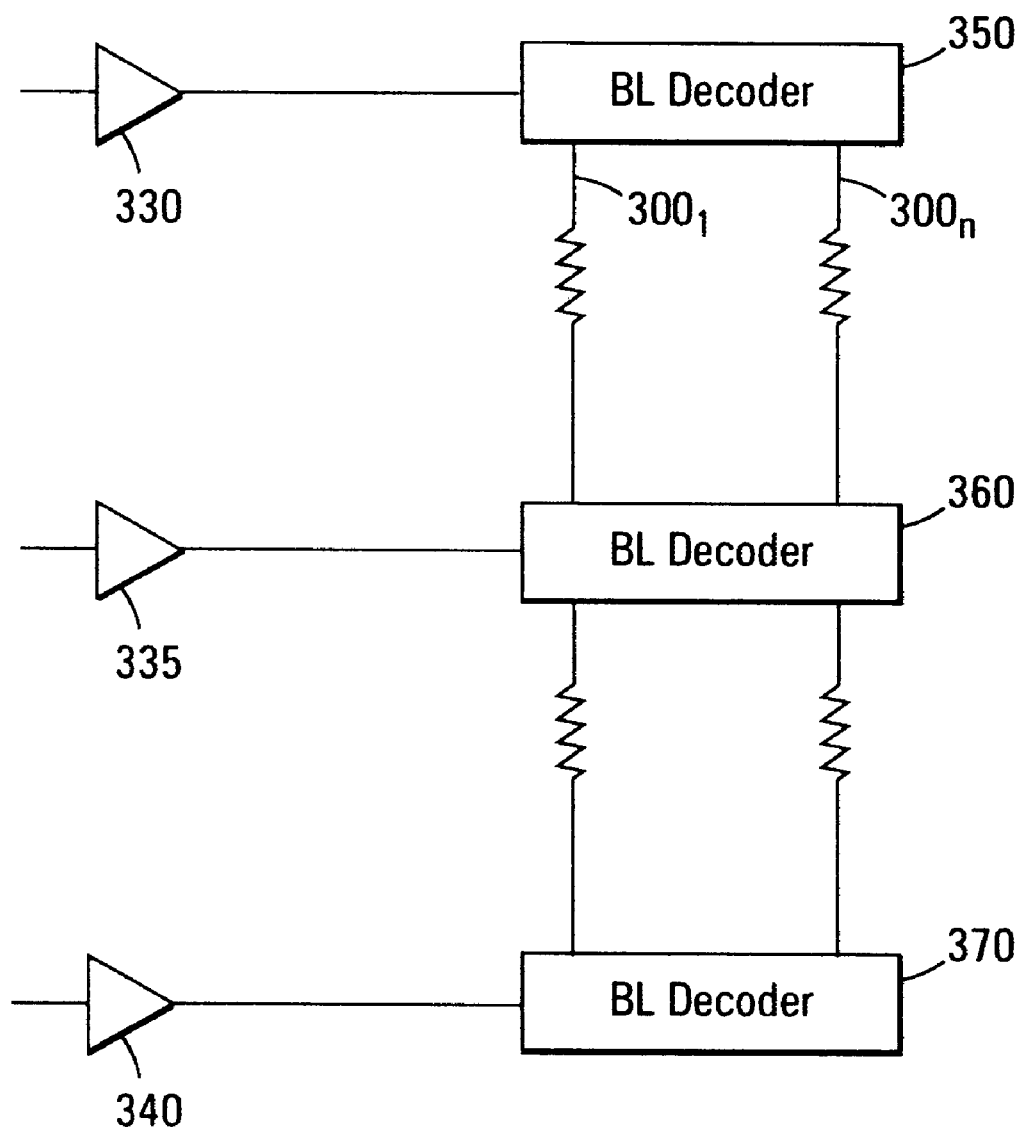
FIG. 6 illustrates a y-multiplex circuits between a driver and multiple bit lines.

The bit line driver circuits are selectively activated using decoder circuitry 360. The decoder circuitry activates one or more driver circuits based upon address signals provided by the external processor/controller 102. In one embodiment, all drivers are activated during a write operation on a selected bit line. In another embodiment, one of the driver circuits is activated based on its location relative to a selected row of the memory array. That is, driver 340 and 335 are activated to program any memory cells located in the bottom half of the bit line, and driver 330 and 335 are activated to program any memory cells located in the top half of the bit line. Unused driver circuits are placed in a tri-state condition. It will be appreciated that activating both drivers at the same time decreases the equivalent resistance to a given cell to Rbl/4 or less and simplifies the decode circuitry. The decoder circuit, in either embodiment, selectively activates the driver circuit(s) in response to address signals provided on external address connections. Bit line decode circuits 350, 360 and 370 can be added between drivers 330, 335 and 346 and a plurality of bit lines $300_1$ and $300_n$, see FIG. 6. As such, the driver circuits can be multiplexed to numerous bit lines.

A non-volatile memory device has been described that has memory cells arranged in addressable columns. The memory cells in each column are coupled to a common bit line. A bit line driver circuit coupled to the bit line includes multiple drivers. In one embodiment, two drivers are coupled to opposite ends of the bit line. The driver circuits can be activated together, or separately, in response to decoder circuitry. The memory device can be a flash memory device having floating gate memory cells.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A memory device comprising:
   an array of voltage programmable memory cells;
   a bit line coupled to a portion of the memory cells; and
   first and second driver circuits respectively coupled to first and second end regions of the bit line.

2. The memory device of claim 1 wherein the memory cells are non-volatile.

3. A memory device comprising:
   an array of memory cells;
   a bit line coupled to a portion of the memory cells; and
   first and second driver circuits respectively coupled to first and second end regions of the bit line, further comprising a decoder circuit to selectively activate the first and second driver circuits.

4. The memory device of claim 3 wherein the decoder circuit selectively activates either the first or second driver circuit independently.

5. The memory device of claim 4 wherein the decoder circuit selectively activates either the first or second driver circuit based upon a location of a memory cell being programmed.

6. A flash memory device comprising:
   an array of floating gate non-volatile memory cells arranged in rows and columns;
   a bit line coupled to a portion of the non-volatile memory cells;
   first and second driver circuits respectively coupled to first and second end regions of the bit line; and
   a decoder circuit to selectively activate the first and second driver circuits.

7. The flash memory device of claim 6 further comprising address input connections to receive externally provided address signals, wherein the decoder circuit selectively activates the first and second driver circuits in response to the address signals.

8. The flash memory device of claim 6 wherein the decoder circuit selectively activates either the first or second driver circuit independently.

9. A method of programming a non-volatile memory comprising:
   selecting a first non-volatile memory cell;
   identifying a bit line coupled to the first non-volatile memory cell; and
   activating either a first or second bit line driver coupled to the identified bit line.

10. The method of claim 9 wherein selecting the first non-volatile memory cell comprises receiving externally provided address signals.

11. The method of claim 10 wherein identifying the bit line comprises decoding the address signals using a decoder circuit.

12. The method of claim 11 wherein the first or second bit line driver is activated by the decoder circuit.

13. The method of claim 9 wherein the first and second bit line drivers are activated simultaneously.

14. A non-volatile memory device comprising:
    an array of non-volatile voltage programmable memory cells arranged in rows and columns;
    a bit line having a resistance of R and coupled to a portion of the non-volatile memory cells; and
    X distributed driver circuits coupled to the bit line, such that a resistance between each of the non-volatile memory cells and any of the driver circuits is less than R/X, wherein X is two or more.

15. A non-volatile memory device comprising:
    an array of non-volatile memory cells arranged in rows and columns;
    a bit line having a resistance of R and coupled to a portion of the non-volatile memory cells; and
    X distributed driver circuits coupled to the bit line, such that a resistance between each of the non-volatile memory cells and any of the driver circuits is less than R/X, wherein X is two or more, further comprising a decoder circuit to selectively activate the X distributed driver circuits.

16. The non-volatile memory device of claim 15 wherein the decoder circuit selectively activates the X distributed driver circuits independently such that only one driver circuit is activated at a time.

17. The non-volatile memory device of claim 15 wherein the decoder circuit selectively simultaneously activates the X distributed driver circuits.

18. The non-volatile memory device of claim 15 wherein the decoder circuit selectively activates the X distributed driver circuits in response to an externally provided array address.

19. The non-volatile memory device of claim 14 wherein X equals two and the two distributed driver circuits are located at opposite ends of the bit line.

20. A method of programming a flash memory comprising:
    initiating a program operation on a first floating gate transistor memory cell;
    identifying a bit line coupled to a drain region of the first floating gate transistor memory cell;
    activating at least one of a plurality of distributed bit line drivers coupled to the identified bit line;
    generating a bit line program voltage with the activated one of the plurality of distributed bit line drivers; and
    coupling the bit line program voltage to the first floating gate transistor memory cell.

21. The method of claim 20 wherein activating at least one of the plurality of distributed bit line drivers comprises simultaneously activating first and second ones of the plurality of distributed bit line drivers.

22. The method of claim 20 wherein un-activated ones of the plurality of distributed bit line drivers are placed in a tri-state condition.

23. A method of programming a flash memory comprising:
    initiating a program operation on a first floating gate transistor memory cell;
    identifying a bit line coupled to a drain region of the first floating gate transistor memory cell;
    activating a plurality of distributed bit line drivers coupled to the identified bit line;

generating a bit line program voltage with the plurality of distributed bit line drivers; and coupling the bit line program voltage to the first floating gate transistor memory cell.

24. A flash memory system comprising:

an external processor; and a flash memory coupled to the external processor comprising, an array of floating gate non-volatile memory cells arranged in rows and columns, a bit line coupled to a column of the non-volatile memory cells, first and second driver circuits respectively coupled to first and second end regions of the bit line, and a decoder circuit to selectively activate the first and second driver circuits.

25. The flash memory system of claim 24 wherein the flash memory further comprising address input connections to receive externally provided address signals, wherein the decoder circuit selectively activates the first and second driver circuits in response to the address signals.

26. The flash memory system of claim 24 wherein the decoder circuit selectively activates either the first or second driver circuit independently.

27. A non-volatile memory device comprising:

an array of non-volatile voltage programmable memory cells arranged in rows and columns;

a bit line having a resistance of R and coupled to the non-volatile memory cells; and X distributed driver circuits coupled to the bit line, wherein first and second ones of the X distributed driver circuits are coupled to opposite ends of the bit line, and a resistance between each of the non-volatile memory cells and any of the driver circuits is less than $R/2(X-1)$.

28. A non-volatile memory device comprising:

an array of non-volatile memory cells arranged in rows and columns;

a bit line having a resistance of R and coupled to the non-volatile memory cells; and X distributed driver circuits coupled to the bit line, wherein first and second ones of the X distributed driver circuits are coupled to opposite ends of the bit line, and a resistance between each of the non-volatile memory cells and any of the driver circuits is less than $R/2(X-1)$, further comprising a decoder circuit to selectively activate the X distributed driver circuits.

29. The non-volatile memory device of claim 28 wherein the decoder circuit selectively activates the X distributed driver circuits independently such that only one driver circuit is activated at a once.

30. A non-volatile memory device comprising:

an array of non-volatile memory cells arranged in rows and columns;

a bit line having a resistance of R and coupled to the non-volatile memory cells; and X distributed driver circuits coupled to the bit line, wherein first and second ones of the X distributed driver circuits are coupled to opposite ends of the bit line, and a resistance between each of the non-volatile memory cells and any of the driver circuits is less than $R/2(X-1)$, wherein all of the distributed driver circuits can be simultaneously activated.

31. A non-volatile memory device comprising:

an array of non-volatile memory cells arranged in rows and columns;

a bit line having a resistance of R and coupled to the non-volatile memory cells; and X distributed driver circuits coupled to the bit line, wherein first and second ones of the X distributed driver circuits are coupled to opposite ends of the bit line, and a resistance between each of the non-volatile memory cells and any of the driver circuits is less than $R/2(X-1)$, wherein all of the distributed driver circuits can be simultaneously activated and wherein an equivalent resistance between the distributed driver circuits and any of the non-volatile memory cells is less than $R/(4*(X-1))$ when all of the distributed driver circuits are simultaneously activated.

\* \* \* \* \*